United States Patent
Chen

(10) Patent No.: US 7,146,141 B2
(45) Date of Patent: Dec. 5, 2006

(54) DIRECT CONVERSION RECEIVER WITH DC OFFSET COMPENSATION AND METHOD THEREOF

(75) Inventor: Peir-Weir Chen, Hsintien (TW)

(73) Assignee: Via Technologies, Inc., Taipei (TW)

( * ) Notice: Subject to any disclaimer, the term of this patent is extended or adjusted under 35 U.S.C. 154(b) by 616 days.

(21) Appl. No.: 10/437,988

(22) Filed: May 15, 2003

(65) Prior Publication Data
US 2004/0229580 A1    Nov. 18, 2004

(51) Int. Cl.
*H04B 1/06* (2006.01)

(52) U.S. Cl. .............. 455/232.1; 455/324; 455/341; 375/345

(58) Field of Classification Search ............ 455/232.1, 455/234.1, 296, 313, 317, 323, 324, 334, 455/338, 340, 341; 375/345, 346
See application file for complete search history.

(56) References Cited

U.S. PATENT DOCUMENTS

| | | | |
|---|---|---|---|
| 6,114,980 A * | 9/2000 | Tilley et al. | 327/307 |
| 6,298,226 B1 | 10/2001 | Lloyd et al. | |
| 6,366,622 B1 * | 4/2002 | Brown et al. | 375/322 |
| 6,516,185 B1 * | 2/2003 | MacNally | 455/234.1 |
| 6,771,945 B1 * | 8/2004 | Pickett et al. | 455/324 |
| 6,985,711 B1 * | 1/2006 | Holenstein et al. | 455/324 |

* cited by examiner

*Primary Examiner*—Quochien B. Vuong
(74) *Attorney, Agent, or Firm*—Rabin & Berdo, P.C.

(57) ABSTRACT

A direct conversion receiver with DC offset compensation. The receiver includes an antenna receiving a RF signal, a mixture module converting the RF signal to a baseband signal, a gain amplifier amplifying the baseband signal, an adder subtracting a DC offset current from the baseband signal, a DC offset cancellation circuit obtaining and converting a DC offset value to the DC offset current, a track-and-hold circuit receiving the baseband signal, holding and transferring a DC offset voltage to the DC offset current, and a switching circuit alternatively coupling and decoupling the DC offset cancellation and track-and-hold circuit to receive the baseband signal.

19 Claims, 8 Drawing Sheets

DIRECT CONVERSION RECEIVER WITH DC OFFSET COMPENSATION AND METHOD THEREOF

BACKGROUND OF THE INVENTION

1. Field of the Invention

The present invention relates to a direct conversion receiver and particularly to a mobile phone direct conversion receiver with DC offset compensation.

2. Description of the Prior Art

In digital communications systems, transmission signals are produced by the modulation of a carrier signal with digital data to be transmitted. The digital data is commonly transmitted in bursts where each burst consists of a number of data bits. When the transmitted signal is received, the signal requires demodulation in order to recover the data.

Radio receiver architectures commonly employ direct conversion (i.e., homodyne) receivers to perform the demodulation of a received signal. A local oscillator operating at the carrier frequency is used to mix down the received signal to produce in-phase (I) and quadrature (Q) baseband signals. Direct conversion receivers are very efficient in terms of both cost and current consumption. The motivation behind the direct conversion receiver is to have the incoming carrier directly converted down to baseband, in both I and Q components, without use of any IF frequencies. However, direct conversion receivers also have drawbacks. For example, a DC-offset can be introduced to the DC level of received signal. A DC-offset arises from mainly three sources: (1) transistor mismatch in the signal path, (2) local oscillator signal leaking and self-downconverting to DC through the mixer, and (3) a large near-channel interferer leaking into the local oscillator and self-downconverting to DC. As a result, a signal that is received from a transmitter can be further distorted, and thereby lead to inaccurate data decoding. Additionally, the DC-offset can be several decibels (dB) larger than the information signal, requiring the DC-offset to be compensate ford for in order to be able to recover the transmitted data in the decoder.

The simple and most immediate way to compensate for for the DC-offset is to estimate the mean value of the received burst, subtract the estimate from the received signal and then feed the signal to the decoder. However, the estimate introduces a bias DC offset, due to the finite amount of data used for estimating the DC-offset. The bias DC offset can be so large that the bit error rate of the receiver does not decrease as the signal-to-noise ratio increases. As a result, the bias DC offset will determine the minimum amount of noise (i.e., the noise floor) that is combined with the data within the receiver.

Furthermore, since the transmitted data is unknown, it is impossible to compensate for for the bias DC offset in the signal before it is supplied to the decoder unless a large amount of data is received (in which the bias DC offset will be reduced to zero) or both the transmitted symbols and the channel are known. A way to overcome this problem is to compensate for the DC level in the decoder. However, while this solves the bias DC offset problem, the dynamics in the decoder will be too large because the DC-offset level can be several decibels (dB) larger than the received signal. Also, numerical problems are encountered when estimating the radio channel and the DC-offset simultaneously because of the magnitude difference between the channel parameters and the DC component.

U.S. Pat. No. 6,298,226 also provides a RF signal receiver with DC offset compensation. FIG. 1 shows a schematic illustration of the receiver 1. The receiver 1 includes a mixer module 12 and an amplifier module 17. The mixer module 12 has an input 13 and an output 15 to connect the mixer module 12 to the antenna 11 and the amplifier module 17. The amplifier module 17 has an output 19 connectable to a signal processing module (not shown). The amplifier module 17 includes components arranged in a forward path and a feedback path. The feedback path and a part of the forward path form a feedback loop.

The forward path includes an amplifier 14, a low-pass filter 16 and an amplifier 18 serially arranged so that a signal from the amplifier 14 is filtered by the low-pass filter 16 and amplified by the amplifier 18. The amplifier 18 is connected to the output 19 and has a gain of about 40 dB. The amplifier 14 is connected to a control line L1 to receive an automatic gain control signal (AGC) from a central controller (not shown). The control signal controls the amplifier 14 to amplify a signal with a desired gain. The amplifier 14 is operable at a gain between 20 dB and −40 dB.

The feedback path includes two amplifiers 20, 22 and a grounded capacitor C interposed between the amplifier 20 and the amplifier 22. An input 21 of the amplifier 20 is associated with an output 23 of the amplifier 18, and an output 25 of the amplifier 22 is connected to a summation point, indicated as an adder 24, between the amplifier 14 and the low-pass filter 16. The amplifier 20 has an output 39 to which the capacitor C is connected. The adder 24 has an output 27 connected to a grounded resistor R and a port 29 of the low-pass filter 16. The adder 24 sums outputs from the amplifier 14 and the amplifier 22 and generates a summation signal output at the output 27. The output from the amplifier 22 is a current I1 and the output from the amplifier 14 is a current I2 so that the summation signal is a current I3.

The amplifiers 20, 22 and the capacitor C implement a track-and-hold circuit which tracks a variable DC offset during a receive time slot. The track-and-hold circuit holds the DC offset during a transmit time slot in which the receiver 1 is inactive. This DC offset is referred to as a compensation value. When the next receive time slot begins, the compensation value from the previous time slot is still "stored" in the capacitor C of the feedback path and immediately available at the adder 24. The stored compensation value is then used to compensate for a DC offset during the present time slot. Advantageously, this minimizes the settling time of the receiver 1.

The amplifier 22 is shown as a transconductance stage because the output current I1 sums with the current I2 from the amplifier 14 into the same load resistance R. Correspondingly, the combination of the amplifier 22 and the resistor R can be considered as a voltage amplifier with a gain factor of about 0.75. The capacitor C is selected to provide unit gain in the feedback loop for a desired frequency.

However, the receiver of the U.S. Pat. No. 6,298,226 needs a relatively long time to complete the DC offset compensation due to the charging time period of the capacitor in the track-and-hold circuit.

SUMMARY OF THE INVENTION

The object of the present invention is to provide an apparatus and method for DC offset compensation in a direct conversion receiver of a mobile phone, which performs a fast and accurate DC offset compensation.

The present invention provides a direct conversion receiver with DC offset compensation. The receiver comprises an antenna receiving a RF signal with a carrier frequency, a mixture module converting the RF signal with the carrier frequency received from the antenna to a baseband signal, an AGC amplifier amplifying the baseband signal from the mixture module with a gain controlled by an automatic gain control signal, an adder subtracting a first DC offset current from the baseband signal amplified by the AGC amplifier during a first time period, and subtracting the first and a second DC offset current from the baseband signal amplified by the AGC amplifier during a second time period, a DC offset cancellation circuit converting the baseband signal from the adder to a digital signal, obtaining a DC offset value in the digital signal and converting the DC offset value to the first DC offset current, a track-and-hold circuit having a capacitor, receiving the baseband signal from the adder, holding a DC offset voltage on the capacitor and transferring the DC offset voltage to the second DC offset current, and a switching circuit coupling the DC offset cancellation circuit to receive the baseband signal from the adder and decoupling the track-and-hold circuit from receiving the baseband signal from the adder during the first time period, and decoupling the DC offset cancellation circuit from receiving the baseband signal from the adder and coupling the track-and-hold circuit to receive the baseband signal from the adder during the second time period.

The present invention further provides a method for DC offset compensation in a direct conversion receiver. The method comprises the steps of receiving a RF signal with a carrier frequency, converting the RF signal with the carrier frequency to a baseband signal, amplifying the baseband signal with a gain controlled by an automatic gain control signal, converting the amplified baseband signal to a digital signal, obtaining a DC offset value in the digital signal, converting the DC offset value to a first DC offset current, subtracting the first DC offset current from the amplified baseband signal, holding a DC offset voltage of the amplified baseband signal from which the first DC offset current has been subtracted from, transferring the DC offset voltage to a second DC offset current, and further subtracting the second DC offset current from the amplified baseband signal from which the first DC offset current has been subtracted.

Thus, by first using a digital controller to obtain the DC offset value to perform a fast coarse compensation and then using a track-and-hold circuit to perform a relatively slow but accurate compensation, the direct conversion receiver of the invention accomplishes a fast and accurate DC offset compensation.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
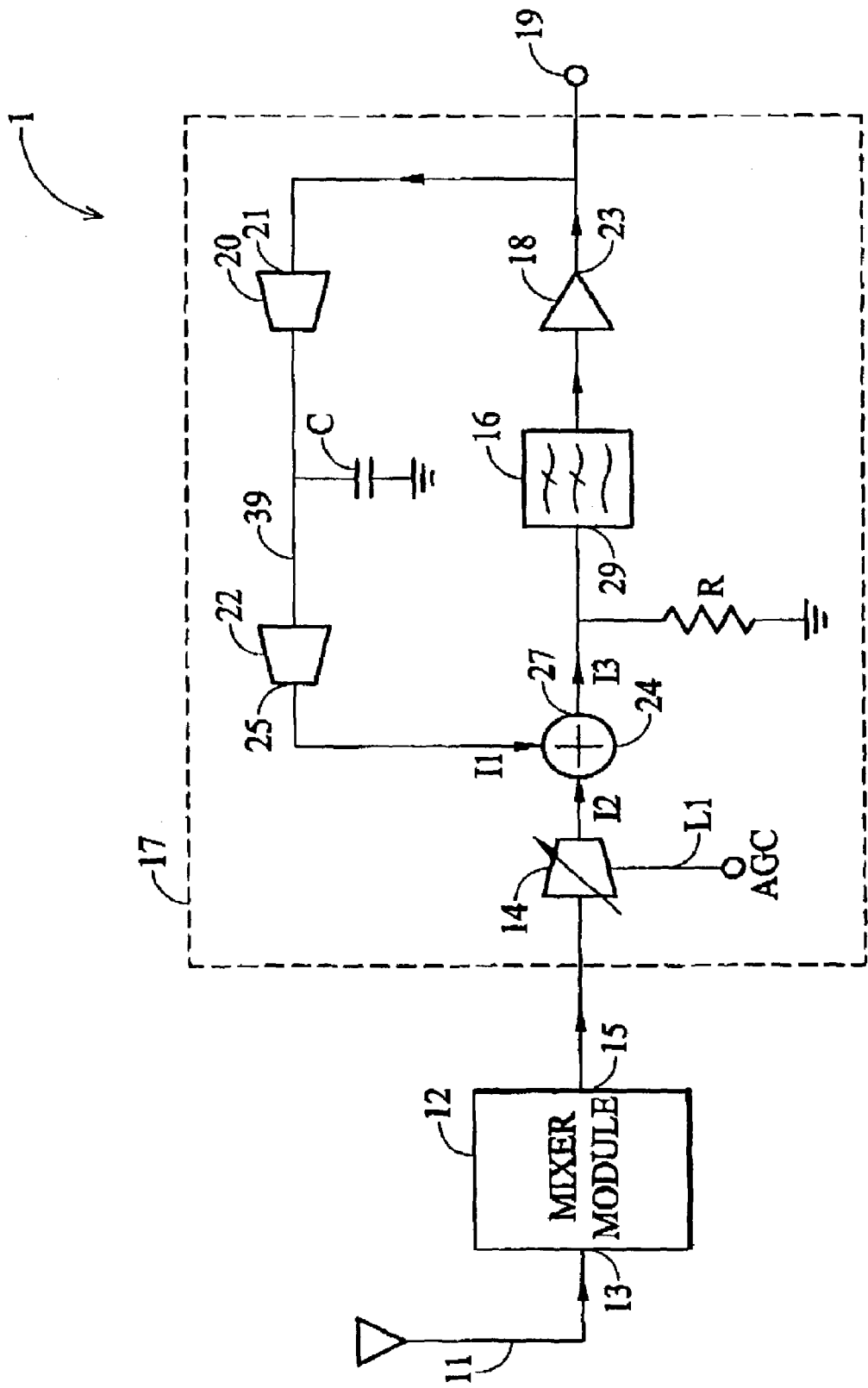
FIG. 1 is a diagram showing a conventional direct conversion receiver.
Figure 2:
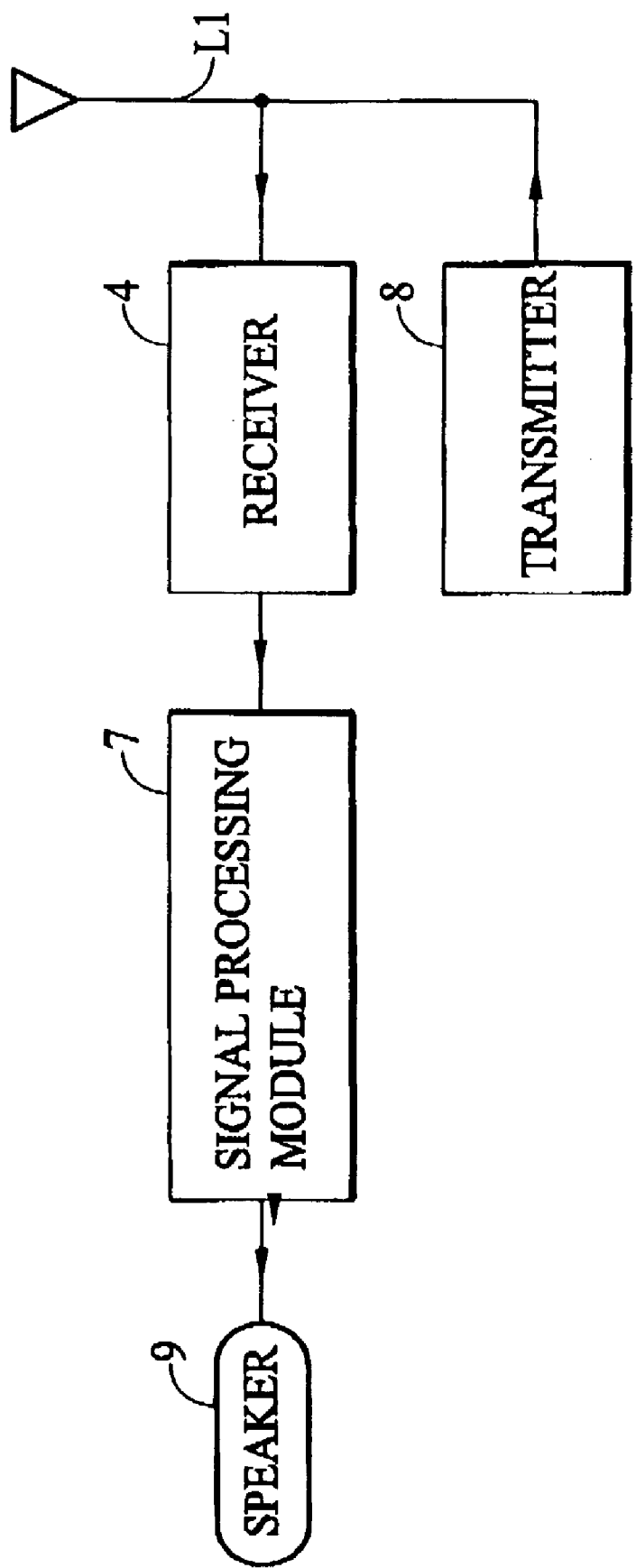
FIG. 2 is a diagram showing a receive path of a mobile phone.

FIG. 2 shows an schematic illustration of the receive path of a mobile phone. The receive path comprises an antenna 61, an RF receiver 4 (hereinafter referred to as receiver), a signal processing module 7 and a speaker 9. The receiver 4 is interconnected between the antenna 61 and the signal processing module 7 connected to the speaker 9. The mobile phone further includes a transmit path indicated in FIG. 2 by means of a transmitter 8 connected to the antenna 61. The RF receiver 4 typically includes several groups of amplifiers separated by frequency-changing circuits (e.g., mixers) to extract information carried by a weak signal voltage that appears at terminals of the antenna 61. The receiver 4 outputs a baseband signal input to the signal processing module 7 for further processing.

Figure 3:
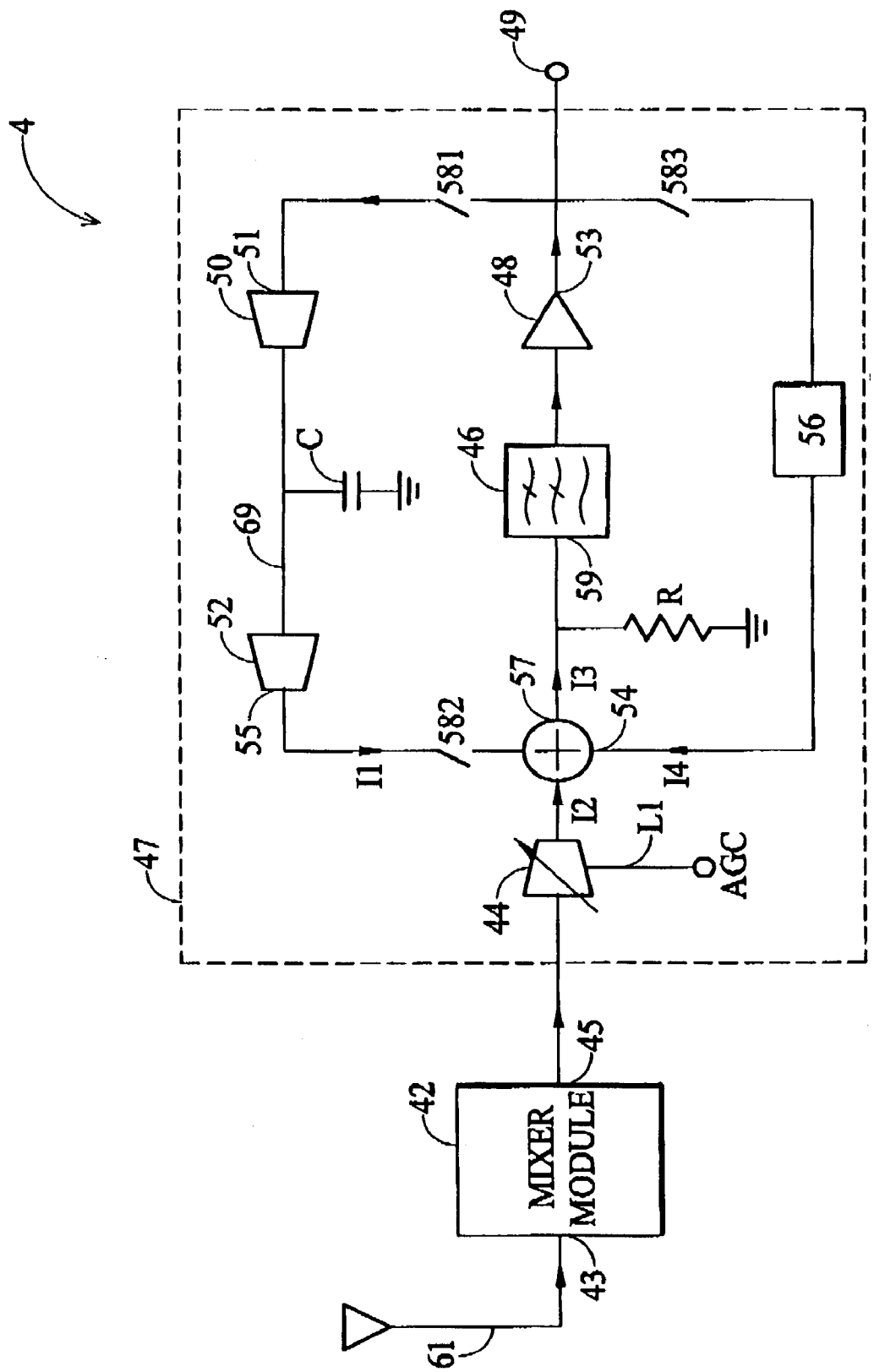
FIG. 3 is a diagram showing a direct conversion receiver according to one embodiment of the invention.

FIG. 3 is a diagram showing a direct conversion receiver according to one embodiment of the invention. The receiver 4 includes a mixer module 42 and an amplifier module 47. The mixer module 42 has an input 43 and an output 45 to connect the mixer module 42 to the antenna 61 and the amplifier module 47. The amplifier module 47 has an output 49 connectable to the signal processing module 7(shown in FIG. 2). The amplifier module 47 includes components arranged in a forward path and two feedback paths. The feedback paths and a part of the forward path form a feedback loop.

The forward path includes an amplifier 44, a low-pass filter 46 and an amplifier 48 serially arranged so that a signal from the amplifier 44 is filtered by the low-pass filter 46 and amplified by the amplifier 48. The amplifier 48 is connected to the output 49 and has a gain of about 40 dB. The amplifier 44 is connected to a control line L1 to receive an automatic gain control signal (AGC) from a central controller (not shown) of the mobile phone. The control signal controls the amplifier 44 to amplify a signal with a desired gain. The amplifier 44 is operable at a gain between 20 dB and −40 dB.

The upper feedback path includes two amplifiers 50, 52, a grounded capacitor C interposed between the amplifier 50 and the amplifier 52, and two switches 581 and 582. The switch 581 is connected between an input 51 of the amplifier 50 and an output 53 of the amplifier 58, and the switch 582 is connected between an output 55 of the amplifier 52 and a summation point, indicated as an adder 44, between the amplifier 44 and the low-pass filter 46. The amplifier 50 has an output 69 to which the capacitor C is connected. The adder 54 has an output 57 connected to a grounded resistor R and a port 59 of the low-pass filter 46.

The amplifiers 50, 52 and the capacitor C implement a track-and-hold circuit that tracks a variable DC offset during a receive time slot. The track-and-hold circuit holds a DC offset voltage by charging the capacitor with the current output from the amplifier 50. The amplifiers 50 and 52 are shown as transconductance amplifiers because the output current I1 sums with the currents I2 and I4 from the amplifier 44 and a DC offset cancellation circuit 56 (explained later) into the same load resistance R. The amplifier 52 transfers the DC offset voltage hold on the capacitor C into the DC offset current I1.

The lower feedback path includes the DC offset cancellation circuit 56 and a switch 583. When the switch 583 is closed, the DC offset cancellation circuit 56 converts the baseband signal received from the amplifier 48 to a digital signal, obtaining a DC offset value in the digital signal and converting the DC offset value to the DC offset current I4.

Figure 4:
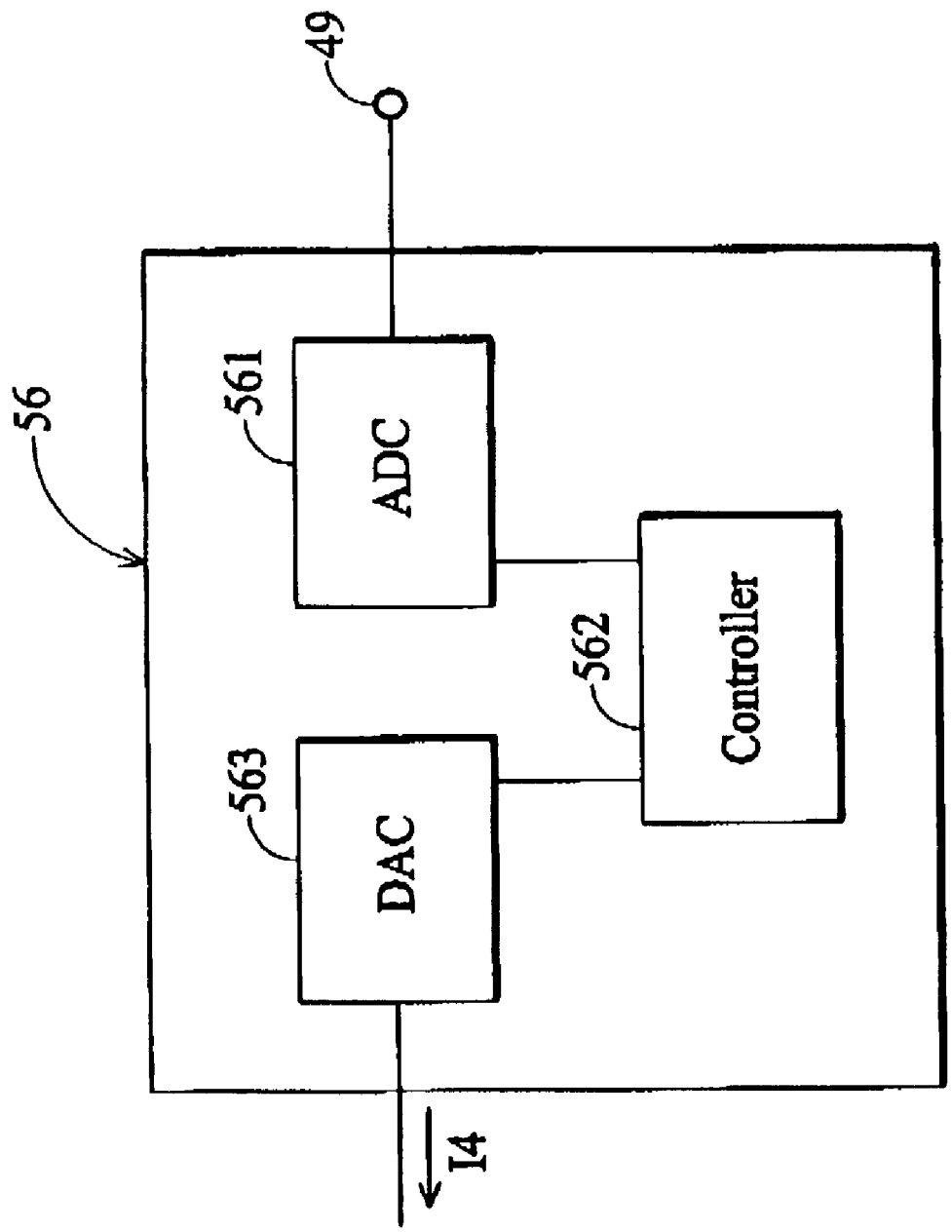
FIG. 4 is a diagram showing a DC offset cancellation circuit of the direct conversion receiver according to one embodiment of the invention.

The DC cancellation circuit 56 is shown FIG. 4. It comprises an analog-to-digital converter 561, a controller 562 and a digital-to-analog converter 563. The analog-to-digital converter 561 converts the baseband signal received from the amplifier 48 to a digital signal. The controller 562 obtains a DC offset value in the digital signal. The current digital-to-analog converter 563 converts the DC offset value to the DC offset current I4.

Figure 5:
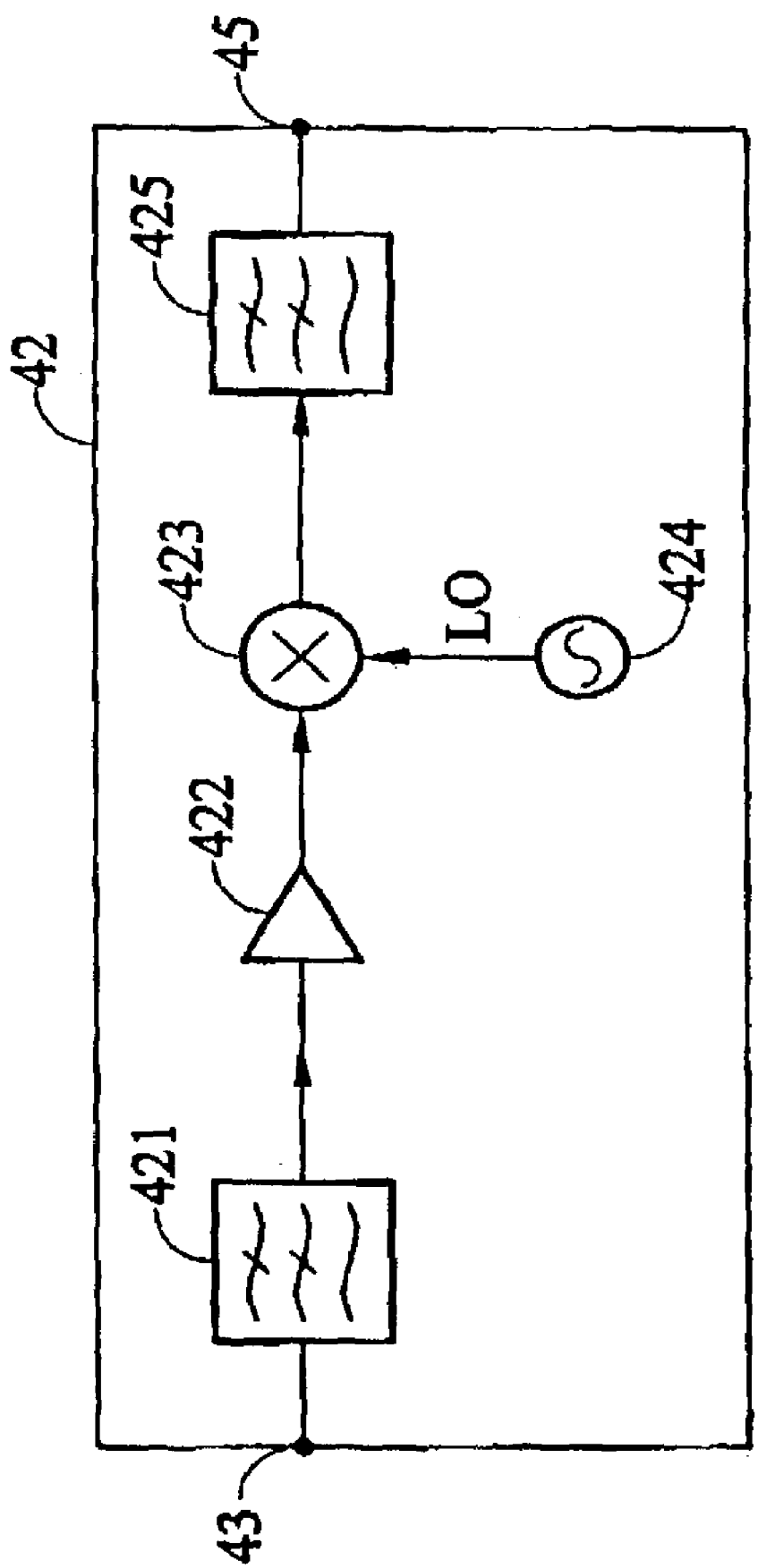
FIG. 5 is a diagram showing a mixer module of the direct conversion receiver according to one embodiment of the invention.

The mixture module 45 is shown in FIG. 5. Generally, a receiver for a radio frequency signal usually comprises a combination of an amplifier and a mixer for signal amplification and frequency conversion. The amplifier, usually a low-noise amplifier (LNA), receives the RF signal, amplifies the RF signal and feeds the amplified RF signal to the mixer which in addition receives a local signal from a local oscillator (LO). The local oscillator signal is, for example, a sinusoidal signal having a constant amplitude and frequency. The mixer generates an output signal that comprises a desired frequency, but also includes undesired frequencies. The output signal is usually filtered to block the undesired frequencies. The mixer module 42 includes two filters 421, 425, an amplifier 422 and a mixer 423. The filter 421 is connected between the input 43 and the amplifier 422. As illustrated, the filter 421 is a bandpass filter that limits the bandwidth of the RF signal received from the antenna 61 to block undesired frequency components. In one embodiment, the passband is about 25 MHz to allow passage of a receive band between 900 MHz and 930 MHz, more precisely between 902 MHz and 928 MHz, and to block frequencies outside of this receive band. The bandlimited RF signal is input to the amplifier 422 in one embodiment a low-noise amplifier (LNA). The mixer 423 receives the RF signal from the LNA 422 and a signal LO generated by a local oscillator 424 in a conventional manner. In one embodiment, the signal LO has a frequency of about 900 MHz. An output of the mixer 423 is connected to the filter 425 a low-pass filter. The low-pass filter 425 has a cut-off frequency of about 600 kHz. Although FIG. 4 shows the local oscillator 424 as belonging to the mixer module 42, it is contemplated that the local oscillator 424 may be located outside the mixer module 42 and at other locations within the mobile phone.

In an exemplary cellular phone system, the RF signal has a carrier frequency of approximately 900 MHz. The RF signal originates from a remote radio transmitter (base transceiver station) which modulates, for example, a 900 MHz signal with a data or voice signal. In this embodiment, the mobile phone is configured for a 900 MHz digital spread spectrum system. The receiver 4 is a direct conversion receiver configured to receive RF signals in a frequency range between 900 MHz and 930 MHz, and to (down) convert these RF signals to the baseband signals. That is, the mixer 423 receives the approximately 900 MHz signal LO and the approximately 900 MHz RF signal and generates an output signal (baseband signal) having a central frequency of ideally 0 Hz. The low-pass filter 425 is connected between the mixer 423 and the output 45. The low-pass filter 425 selects the desired baseband and blocks frequencies higher than a predetermined cut-off frequency of, for example, about 600 kHz. It is contemplated that other values for the cut-off frequency can chosen, as long as undesired frequencies are sufficiently blocked.

The signal LO generated by the local oscillator 32 can be a sinusoidal signal having a frequency between 500 MHz and 2.5 MHz. In one embodiment, the signal LO has a frequency between 903 MHz and 927 MHz. Other phone systems operate, for example, at carrier frequencies of about 1800 MHz or 1900 MHz. Alternatively, the cellular phone can be a dual band cellular phone which can operate within one of two frequency bands, for example, 900 MHz or 1800 MHz. In a direct conversion receiver, the frequency of the signal LO is generally selected to generate an output signal in the baseband. The embodiment of the invention is hereinafter described with reference to a 900 MHz wireless phone system. However, it is contemplated that this embodiment of the invention is also applicable in cellular phone systems operating at other carrier frequencies such as 800 MHz, 1800 MHz or 1900 MHz.

In the previously described receiver 4, at the beginning (in a first time period), the switch 583 is closed and the switches 581 and 582 is opened. The adder 54 sums output currents I4 and I2 respectively from the DC offset cancellation circuit 56 and the amplifier 52, and generates a summation current signal I3. The DC offset current I4 is subtracted from the RF current signal I2. Since the DC offset cancellation circuit uses a current DAC 563 with limited number of bits (3 bits for example), there is still a small DC offset current existing in the current I3.

Then (in a second time period), the switch 583 is opened and the switches 581 and 582 are closed. The current DAC 563 of the DC cancellation circuit keeps outputting the DC offset current I4. The track-and-hold circuit is activated to output the DC offset current I1. The track-and-hold circuit accurately outputs the small DC offset current left in the current I3 from which the DC offset current I4 has been subtracted. The current I3 now has no DC offset current.

Figure 6:
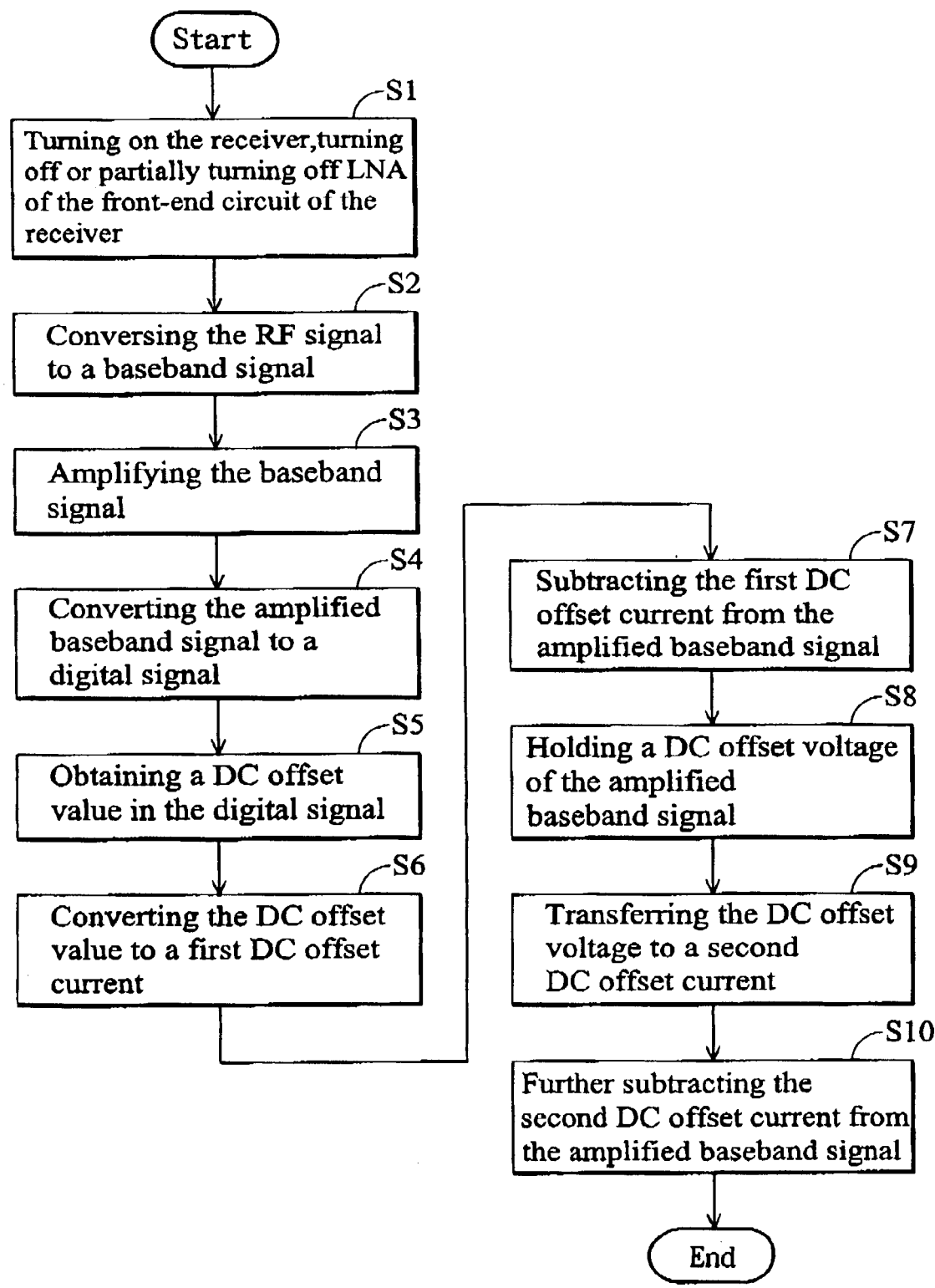
FIG. 6 is a flowchart of a method for DC offset compensation in a direct conversion receiver according to one embodiment of the invention.

FIG. 6 is a flowchart of a method for DC offset compensation in a direct conversion receiver according to one embodiment of the invention.

In step S1, a RF signal with a carrier frequency is received.

In step S2, the received RF signal with the carrier frequency is conversed to a baseband signal with a central frequency of 0 Hz.

In step S3, the baseband signal is amplified with a gain controlled by an automatic gain control signal.

In step S4, the amplified baseband signal is converted to a digital signal;

In step S5, a DC offset value in the digital signal is obtained.

In step S6, the DC offset value is converted to a first DC offset current.

In step S7, the first DC offset current is subtracted from the amplified baseband signal.

In step S8, a DC offset voltage of the amplified baseband signal from which the first DC offset current has been subtracted from is hold by a capacitor.

In step S9, the DC offset voltage is transferred to a second DC offset current.

In step S10, the second DC offset current is further subtracted from the amplified baseband signal from which the first DC offset current has been subtracted.

Figure 7:
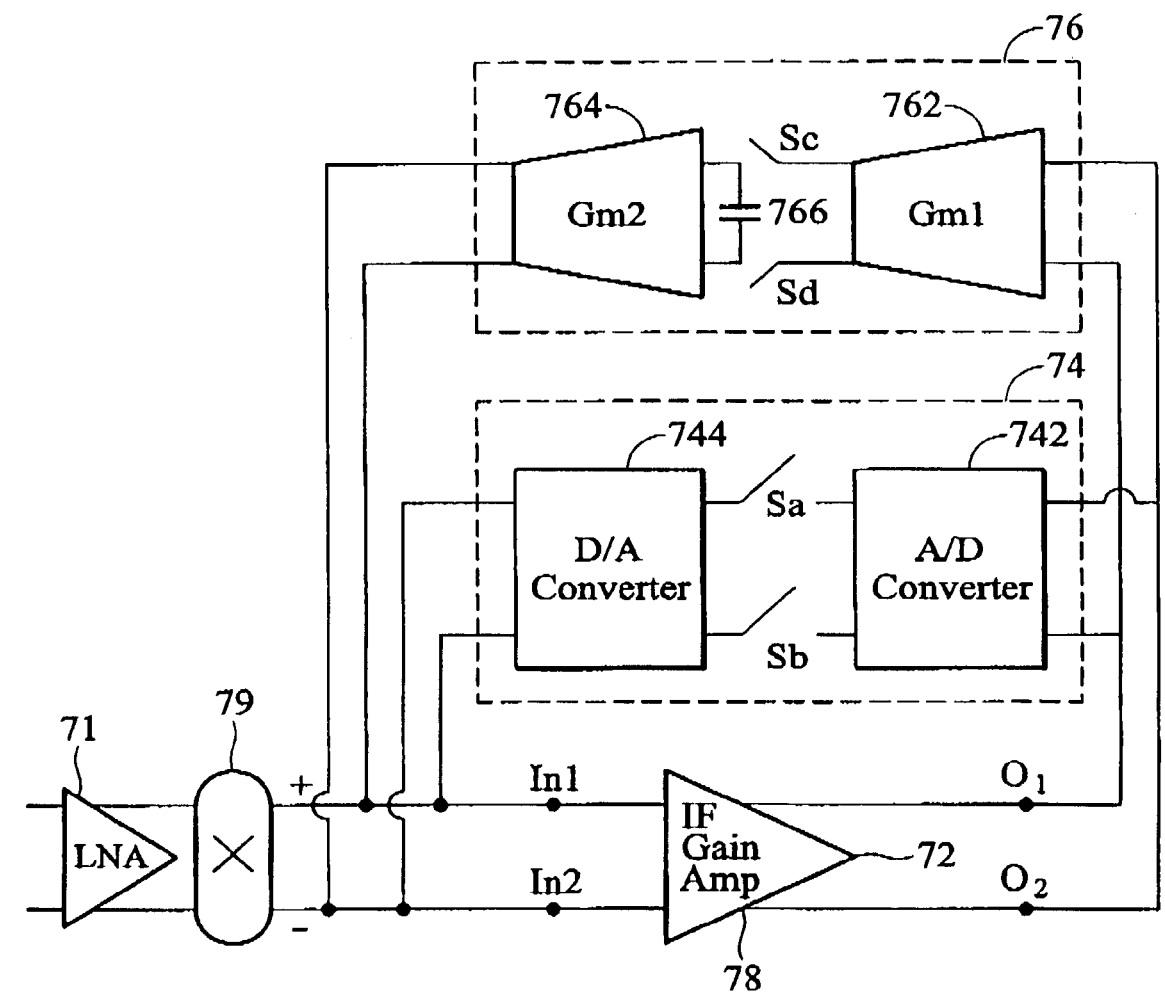
FIG. 7 is a diagram showing a DC offset cancellation circuit of the direct conversion receiver according to another embodiment of the invention.

FIG. 7 is a diagram showing a direct conversion receiver according to another embodiment of the invention. It includes a LNA (Low Noise Amplifier) 71, a mixer 79, a IF (Intermediate Frequency) gain amplifier 72, a coarse DC offset cancellation circuit 74 and a fine DC offset cancellation circuit 76. The gain amplifier 72 has a positive and negative input terminal In1, In2 for receiving a differential RF signal from the LNA (Low Noise Amplifier) 71 of front-end circuit of the receiver. The coarse DC offset cancellation circuit 74 has two input terminals coupled to the output terminals O1, O2 of the gain amplifier 72 and two output terminals coupled to the input terminals In1, In2 of the gain amplifier 72, and includes a DAC 744, a ADC 742 and two switches Sa and Sb coupled between the DAC 744 and ADC 742. The fine DC offset cancellation circuit 76 has two input terminals coupled to the output terminals O1, O2 of the gain amplifier 72 and two output terminals coupled to the input terminals In1, In2 of the gain amplifier 72, and includes two transconductances 764 and 762, two switches Sc and Sd coupled between the transconductances 764 and 762, and a capacitor 766 coupled between the two differential input terminals of the transconductance 764.

At the beginning (in a first time period), the switch Sa and Sb are closed and the switches Sc and Sd is opened. The DAC 744 and ADC 742 perform coarse DC offset cancellation. Then (in a second time period), the switch Sa and Sb are opened and the switches Sc and Sd are closed. The transconductances 762 and 764, and the capacitor 766 perform fine DC offset cancellation. Since the circuit 76 take care of fine DC offset cancellation, the bit number of the DAC 746 and ADC 742 are reduced. This prevents a DAC and ADC with a large circuit area used in the receiver. Further, since the circuit 76 only perform fine DC offset cancellation, a long charge time to hold capacitor is also prevented. For example, with an initial DC offset of 1V in the received differential RF signal and an accuracy requirement of 1 mV, a 10 bit DAC and ADC are needed without the circuit 76. However, by using the circuit 76, only a 5 bit DAC and ADC are needed. A DC offset voltage of 30 mV will be left after the differential RF signal is processed by the coarse DC offset cancellation circuit 74. The circuit 76 can take care of this 30 mV easily.

Figure 8:
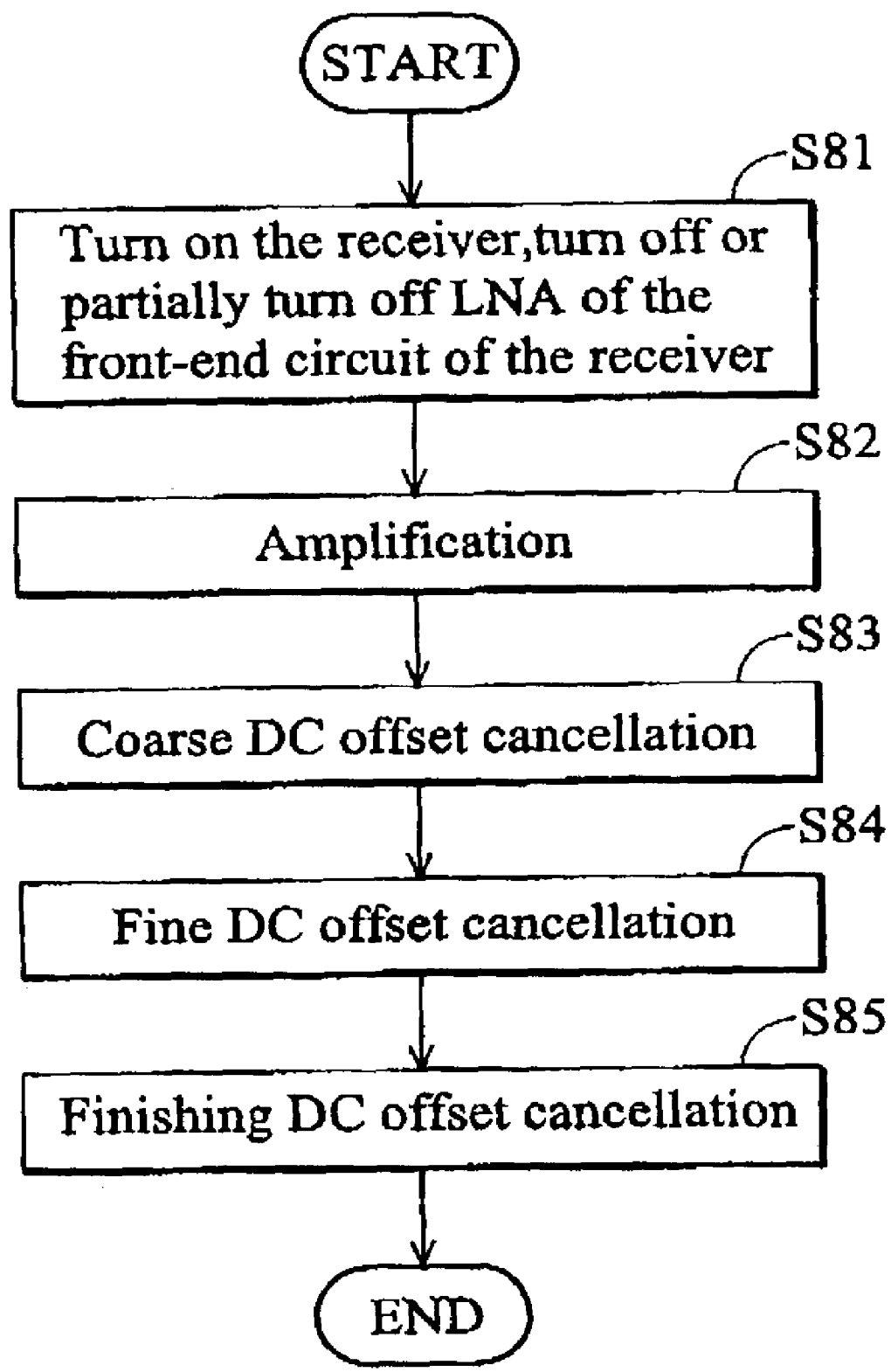
FIG. 8 is a flowchart of a method for DC offset compensation in a direct conversion receiver according to another embodiment of the invention.

FIG. 8 is a flowchart of a method for DC offset compensation in a direct conversion receiver according to one embodiment of the present invention.

In step S81, a differential RF signal is received from the receiver. Turn on the receiver, turn off or partially turn off LNA of the front-end circuit of the receiver.

In step S82, the DC offset generated by devices matched and LO (local oscillator) self-mixing is amplified by a gain amplifier and contains a DC offset of about 1V.

In step S83, a coarse DC offset cancellation circuit is coupled to the gain amplifier so that the amplifier signal is transferred through a 5 bit DAC and ADC, and back to the input terminals of the amplifier. Thus, the DC offset of the received RF signal is reduced to 30 mV.

In step S84, a fine DC offset cancellation circuit is coupled to the gain amplifier 72 and the coarse DC offset cancellation circuit is cut off from the amplifier so that the amplifier signal is transferred through transconductances and a capacitor, and back to the input terminals of the amplifier. Thus, the DC offset is further reduced from 30 mV to 1 mV.

In step S85, the fine DC offset cancellation circuit is cut off from the amplifier.

In conclusion, the present invention provides an apparatus and method for DC offset compensation in a direct conversion receiver of a mobile phone. By first using a digital controller to obtain the DC offset value to perform a fast coarse compensation and then using a track-and-hold circuit to perform a relatively slow but accurate compensation, the direct conversion receiver of the invention accomplishes a fast and accurate DC offset compensation.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A direct conversion receiver with DC offset compensation comprising:
    an antenna receiving a RF signal with a carrier frequency;
    a mixture module converting the RF signal with the carrier frequency received from the antenna to a baseband signal;
    an AGC amplifier amplifying the baseband signal from the mixture module with a gain controlled by an automatic gain control signal;
    an adder subtracting a first DC offset current from the baseband signal amplified by the AGC amplifier during a first time period, and subtracting the first and a second DC offset current from the baseband signal amplified by the AGC amplifier during a second time period;
    a DC offset cancellation circuit converting the baseband signal from the adder to a digital signal, obtaining a DC offset value in the digital signal and converting the DC offset value to the first DC offset current;
    a track-and-hold circuit having a capacitor, receiving the baseband signal from the adder, holding a DC offset voltage on the capacitor and transferring the DC offset voltage to the second DC offset current; and
    a switching circuit coupling the DC offset cancellation circuit to receive the baseband signal from the adder and decoupling the track-and-hold circuit from receiving the baseband signal from the adder during the first time period, and decoupling the DC offset cancellation circuit from receiving the baseband signal from the adder and coupling the track-and-hold circuit to receive the baseband signal from the adder during the second time period.

2. The direct conversion receiver as claimed in claim 1, wherein the automatic gain control signal is output from a central controller of a mobile phone.

3. The direct conversion receiver as claimed in claim 1 further comprising:
    a resistor connected between the adder and a ground;
    a low-pass filter with an input connected to the adder; and
    an amplifier with an input connected to the low-pass filter and an output connected to the switching circuit.

4. The direct conversion receiver as claimed in claim 3, wherein the switching circuit comprises:
    a first switch connected between the amplifier and the track-and-hold circuit, opened and closed during the first and second time period respectively;
    a second switch connected between the adder and the track-and-hold circuit, and opened and closed during the first and second time period respectively; and
    a third switch connected between the adder and the DC offset cancellation circuit, and opened and closed during the second and first time period respectively.

5. The direct conversion receiver as claimed in claim 1, wherein the mixture module comprises:
    a band-pass filter receiving the RF signal from the antenna;

a low-noise amplifier receiving the RF signal filtered by the band-pass filter;

a mixer mixing the RF signal amplified by low-noise amplifier with a local oscillation signal; and a low-pass filter filtering the mixed RF signal form the mixer and outputting the baseband signal.

6. The direct conversion receiver as claimed in claim 5, wherein the local oscillation signal is output from a local oscillator.

7. The direct conversion, receiver as claimed in claim 1, wherein the DC offset cancellation circuit comprises:

an analog-to-digital converter converting the baseband signal from the adder to the digital signal;

a controller obtaining the DC offset value in the digital signal; and a digital-to-analog converter converting the DC offset value to the first DC offset current.

8. The direct conversion receiver as claimed in claim 7, wherein the digital-to-analog converter is a 3-bit current DAC.

9. The direct conversion receiver as claimed in claim 1, wherein the track-and-hold circuit further comprises:

a first transconductance amplifier receiving the baseband signal from the adder and outputting a corresponding current charging the capacitor to generate the DC offset voltage; and a second transconductance amplifier receiving the DC offset voltage hold on the capacitor and outputting the second DC offset current.

10. The direct conversion receiver as claimed in claim 1, wherein the baseband signal processed by the direct conversion receiver is sent to a signal processing module of a mobile phone.

11. The direct conversion receiver as claimed in claim 1, wherein the carrier frequency is 900 MHz.

12. The direct conversion receiver as claimed in claim 1, wherein the carrier frequency is 1800 MHz.

13. A method for compensating a DC offset voltage in a direct conversion receiver comprising the steps of:

receiving a RF signal with a carrier frequency;

converting the RF signal with the carrier frequency to a baseband signal;

amplifying the baseband signal with a gain controlled by an automatic gain control signal;

converting the amplified baseband signal to a digital signal;

obtaining a DC offset value in the digital signal;

converting the DC offset value to a first DC offset current;

subtracting the first DC offset current from the amplified baseband signal;

holding a DC offset voltage of the amplified baseband signal from which the first DC offset current has been subtracted;

transferring the DC offset voltage to a second DC offset current; and further subtracting the second DC offset current from the amplified baseband signal from which the first DC offset current has been subtracted.

14. A DC offset cancellation circuits comprising:

a gain amplifier amplifying a baseband signal with a gain controlled by an automatic gain control signal;

coarse offset cancellation means coupled to the gain amplifier, including an A/D converter and a D/A converter, the A/D converter converting an analog signal from the gain amplifier into a digital signal in order to obtain a DC offset value, and converting the DC offset value to a first DC offset current;

fine offset cancellation means having a capacitor, receiving the baseband signal, holding a DC offset voltage on the capacitor and transferring the DC offset voltage to a second DC offset current; and switching means for coupling the coarse offset cancellation means to receive the baseband signal and decoupling the fine offset cancellation means from receiving the baseband signal during a first time period, and decoupling the coarse offset cancellation means from receiving the baseband signal and coupling the fine offset cancellation means to receive the the baseband signal during a second time period.

15. The DC offset cancellation circuit claimed in claim 14, further comprising:

a mixture module converting the RF signal with the carrier frequency received from the antenna to a baseband signal; and an adder subtracting a first DC offset current from the baseband signal amplified by the gain amplifier during the first time period, and subtracting the first and the second DC offset current from the baseband signal amplified by the gain amplifier during a the second time period.

16. The DC offset cancellation circuit claimed in claim 14, further comprising:

a mixer coupled to the gain amplifier;

a low noise amplifier of a front-end circuit of a receiver, which is coupled to the mixer.

17. The DC offset cancellation circuit as claimed in claim 14, wherein the fine offset cancellation means comprises:

a first transconductance receiving the baseband signal and outputting a corresponding current charging the capacitor to generate the DC offset voltage; and a second transconductance receiving the DC offset voltage hold on the capacitor and outputting the second DC offset current.

18. A DC offset cancellation circuit comprising:

an amplifier having input terminals receiving an differential RF signal from a receiver;

a coarse DC offset cancellation circuit having a DAC, ADC and two first switches coupled therebetween; and a fine DC offset cancellation circuit having a first and second transconductance, a capacitor and two second switches, wherein the capacitor is coupled between input terminals of the second transconductance and the two second switches are coupled between the first and second transconductance;

wherein the first switches are closed and the second switches are opened during a first period of time, and the second switches are closed and the first switches are opened during a second period of time.

19. A method for compensating a DC offset voltage in a direct conversion receiver comprising the steps of:

turning on the receiver and turning off a LNA of the front-end circuit of the receiver;

generating a DC offset and being amplified by a gain amplifier;

canceling the DC offset by a DC offset cancellation circuit having a DAC, ADC and two first switches coupled therebetween;

canceling the DC offset by a fine DC offset cancellation circuit having a first and second transconductance, a capacitor and two second switches, wherein the capacitor is coupled between input terminals of the second transconductance and the two second switches are coupled between the first and second transconductance;

wherein the first switches are closed and the second switches are opened during a first period of time, and the second switches are closed and the first switches are opened during a second period of time.

* * * * *